(12) United States Patent
Gosen et al.

(10) Patent No.: US 9,013,673 B2
(45) Date of Patent: Apr. 21, 2015

(54) LITHOGRAPHIC APPARATUS AND DEVICE MANUFACTURING METHOD

(75) Inventors: Jeroen Gerard Gosen, Geldrop (NL); Koen Cuypers, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 645 days.

(21) Appl. No.: 12/953,113

(22) Filed: Nov. 23, 2010

(65) Prior Publication Data

US 2011/0129782 A1    Jun. 2, 2011

Related U.S. Application Data

(60) Provisional application No. 61/265,901, filed on Dec. 2, 2009.

(51) Int. Cl.
*G03F 7/20* (2006.01)

(52) U.S. Cl.
CPC .......... *G03F 7/7085* (2013.01); *G03F 7/70341* (2013.01)

(58) Field of Classification Search
CPC ............ G03F 7/70341; G03F 7/70716; G03F 7/70775; G03F 7/7085
USPC ........................ 355/30, 52, 53, 55, 67–74, 77; 250/492.1, 492.2, 492.22, 548; 430/5, 430/8, 22, 30, 311, 312, 321, 325
See application file for complete search history.

(56) References Cited

U.S. PATENT DOCUMENTS

| | | | |
|---|---|---|---|
| 4,509,852 A | | 4/1985 | Tabarelli et al. |
| 6,724,460 B2 * | | 4/2004 | Van Schaik et al. ............ 355/30 |
| 2004/0136494 A1 | | 7/2004 | Lof et al. |
| 2004/0207824 A1 | | 10/2004 | Lof et al. |
| 2005/0046934 A1 | | 3/2005 | Ho et al. |
| 2005/0052632 A1 * | | 3/2005 | Miyajima ........................ 355/53 |
| 2005/0094125 A1 | | 5/2005 | Arai |
| 2005/0259232 A1 * | | 11/2005 | Streefkerk et al. .............. 355/53 |
| 2005/0259234 A1 * | | 11/2005 | Hirukawa et al. ................ 355/53 |
| 2005/0264778 A1 * | | 12/2005 | Lof et al. ......................... 355/53 |
| 2006/0007419 A1 * | | 1/2006 | Streefkerk et al. .............. 355/53 |
| 2006/0028628 A1 | | 2/2006 | Lin et al. |
| 2006/0082741 A1 * | | 4/2006 | Van Der Toorn et al. ....... 355/30 |

(Continued)

FOREIGN PATENT DOCUMENTS

| | | |
|---|---|---|
| EP | 1420300 A2 | 5/2004 |
| EP | 1632813 A2 | 3/2006 |
| JP | 2005-277363 | 10/2005 |
| JP | 2007-109741 | 4/2007 |

(Continued)

OTHER PUBLICATIONS

525017, RD, Jan. 10, 2008, Anonymous.

(Continued)

*Primary Examiner* — Christina Riddle

(74) *Attorney, Agent, or Firm* — Pillsbury Winthrop Shaw Pittman LLP

(57) ABSTRACT

An immersion lithographic apparatus is provided having a table configured to support a substrate; a sensor or target for a sensor is provided on a surface of the table and a cover is provided extending from an edge of the table; in addition, a liquid displacement device is provided including a gas outlet configured to direct a localized gas flow towards the sensor or target so as to displace liquid from the sensor or target over the cover and off the table.

23 Claims, 9 Drawing Sheets

(56) References Cited

U.S. PATENT DOCUMENTS

| | | |
|---|---|---|
| 2006/0119809 A1 | 6/2006 | Verhagen et al. |
| 2006/0132737 A1* | 6/2006 | Magome et al. ............... 355/53 |
| 2006/0139594 A1* | 6/2006 | Hara et al. ..................... 355/53 |
| 2006/0203218 A1* | 9/2006 | Shirai et al. .................... 355/53 |
| 2006/0250602 A1 | 11/2006 | Sato et al. |
| 2006/0257553 A1 | 11/2006 | Ohta et al. |
| 2006/0285092 A1* | 12/2006 | Ono ................................ 355/30 |
| 2007/0081135 A1 | 4/2007 | Kamono |
| 2009/0002651 A1* | 1/2009 | To .................................. 355/30 |
| 2009/0237632 A1 | 9/2009 | Direcks et al. |
| 2010/0157260 A1 | 6/2010 | Knaapen et al. |

FOREIGN PATENT DOCUMENTS

| | | |
|---|---|---|
| JP | 2008-258381 | 10/2008 |
| JP | 2009-135548 | 6/2009 |
| JP | 2010-021370 | 1/2010 |
| WO | 99/49504 | 9/1999 |
| WO | 2005/043607 | 5/2005 |
| WO | 2005/064405 A2 | 7/2005 |
| WO | 2005-081290 A1 | 9/2005 |

OTHER PUBLICATIONS

Japanese Office Action mailed Jun. 13, 2012 in corresponding Japanese Patent Application No. 2010-261888.

* cited by examiner

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/265,901, entitled "Lithographic Apparatus and Device Manufacturing Method", filed on Dec. 2, 2009. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water, although another liquid can be used, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

In an immersion apparatus, immersion liquid is handled by a fluid handling system or apparatus, for example a fluid handling structure. A fluid handling system may supply immersion fluid and therefore be a fluid supply system. A fluid handling system may confine fluid and thereby be a fluid confinement system. A fluid handling system may provide a barrier to fluid and thereby be a barrier member. A fluid handling system may create or use a flow of fluid (such as gas), for example to help in handling liquid. Immersion liquid may be used as the immersion fluid. In that case, the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be beneficial because then the whole top surface of the substrate is exposed to the substantially same conditions. This may have a benefit for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

It is desirable to be able to move the substrate as fast as possible below the projection system. For this, measures may be taken to reduce problems that may be caused by liquid loss from the fluid handling system, which may occur at high speeds.

Water may remain on surfaces where it is undesirable, yet difficult to move, such as a sensor or a sensor target. It may be difficult to move the remaining water because the surface may be hydrophilic.

According to an aspect, there is provided a lithographic apparatus including:

a table configured to support a substrate, the table having a surface on which is provided a sensor, a target for a sensor, or both;

a liquid handling structure configured to provide liquid to a space adjacent the substrate and/or table;

a liquid displacement device including a gas outlet configured to direct a localized gas flow towards the sensor or target, or both, so as to displace liquid from the sensor and/or target and off the table.

According to an aspect, there is provided a device manufacturing method including:

projecting an image of a pattern through an immersion liquid onto a substrate held by a substrate table, the substrate table having: a cover extending from an edge of the table; and having a surface on which is provided a sensor, a target for a sensor, or both; and displacing liquid from the sensor and/or target using a localized gas flow such that the liquid is displaced off the table, or onto the cover at the edge of the table, or both.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
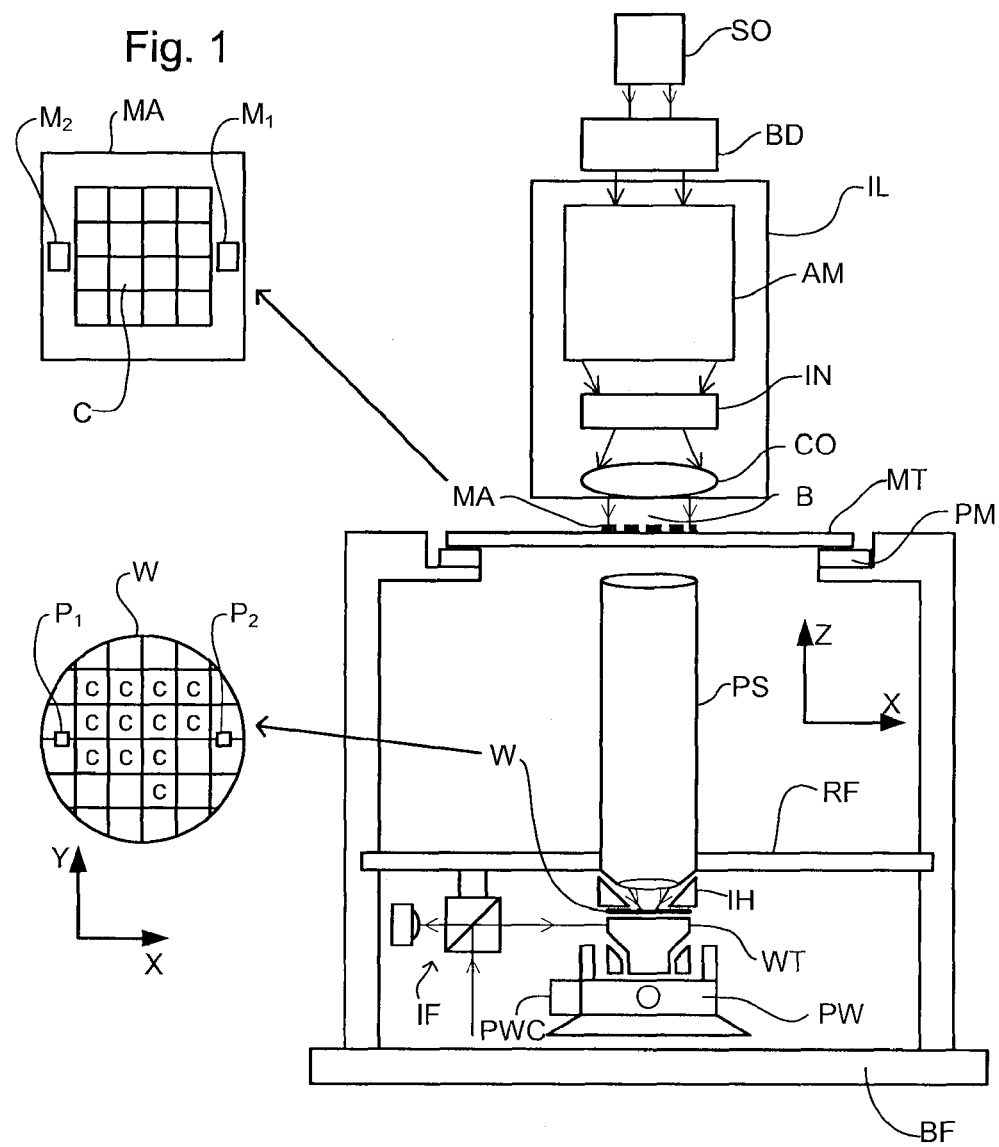
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation or DUV radiation).

a patterning device support or support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support MT holds the patterning device. It holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support MT and the substrate table WT are scanned synchronously while a pattern imparted to the radiation beam is projected onto a target portion C (i.e. a single dynamic exposure). The velocity and direction of the substrate table WT relative to the patterning device support MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate. The volume or space filled with liquid remains substantially stationary relative to the projection system PS while the substrate W moves underneath that area. FIGS. 2-5 show different supply devices which can be used in such a system.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 (which are described below) may be used in such a system. However, sealing features might not be present, might not be activated, might not be as efficient as normal or might otherwise be ineffective to seal liquid to only the localized area.

Figure 2:
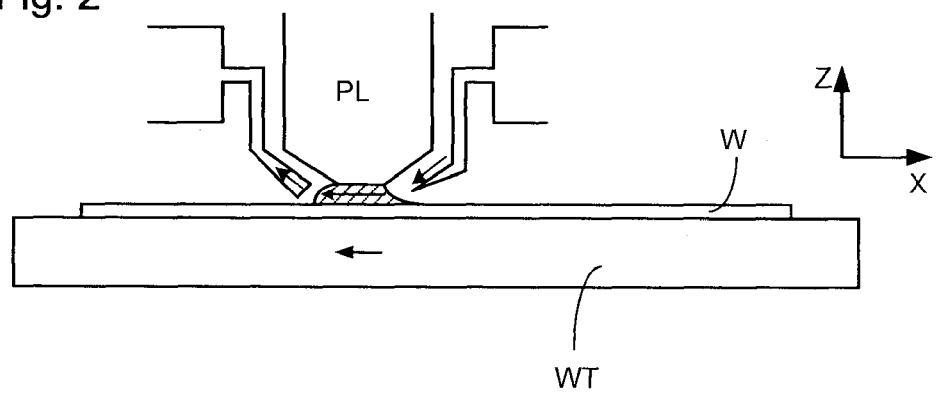
FIGS. 2 and 3 depict a liquid supply system for use in a lithographic projection apparatus.
Figure 3:
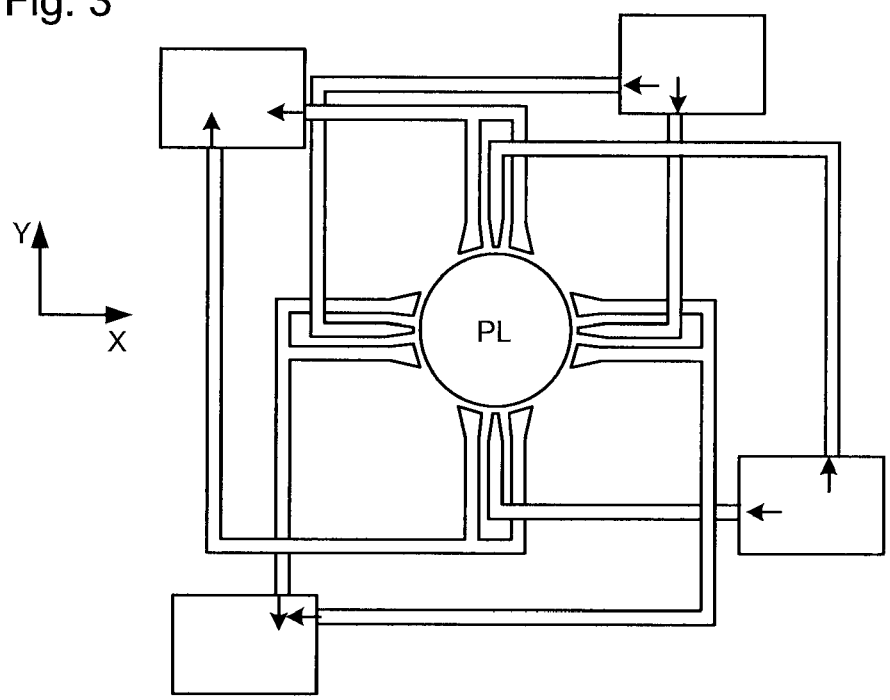

Four different types of localized liquid supply systems are illustrated in FIGS. 2-5. As illustrated in FIGS. 2 and 3, liquid is supplied by at least one inlet onto the substrate as indicated by an arrow, preferably along the direction of movement of the substrate relative to the final element. Liquid is removed by at least one outlet after having passed under the projection system as indicated by an arrow. As the substrate is scanned beneath the element in a −X direction, liquid is supplied at the +X side of the element and taken up at the −X side. FIG. 2 shows the arrangement schematically in which liquid flow is indicated by arrows; the liquid is supplied via inlet and is taken up on the other side of the element by outlet which is connected to a low pressure source. In the illustration of FIG. 2 the liquid is supplied along the direction of movement of the substrate relative to the final element, although this does not need to be the case. Various orientations and numbers of in- and out-lets positioned around the final element are possible; one example is illustrated in FIG. 3 in which four sets of an inlet with an outlet on either side are provided in a regular pattern around the final element, as indicated by arrows.

Figure 4:
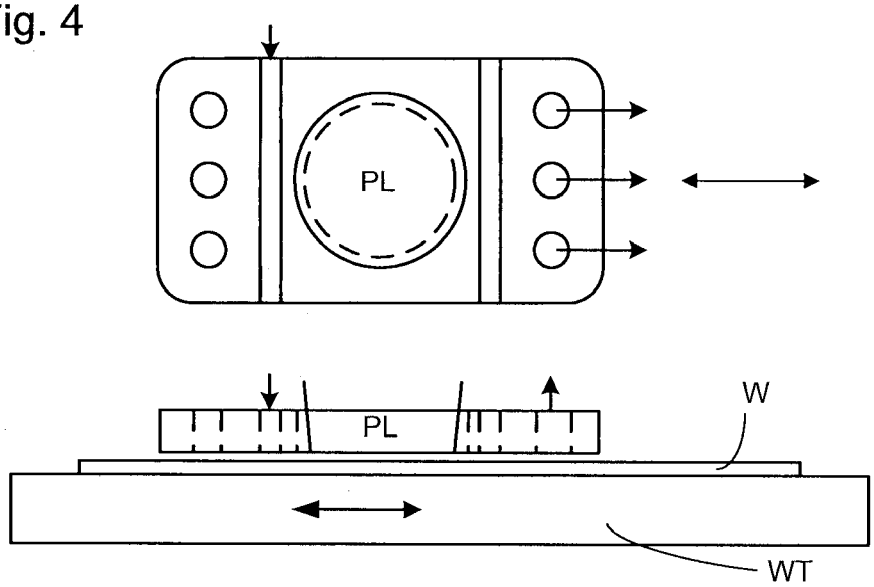
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Figure 5:
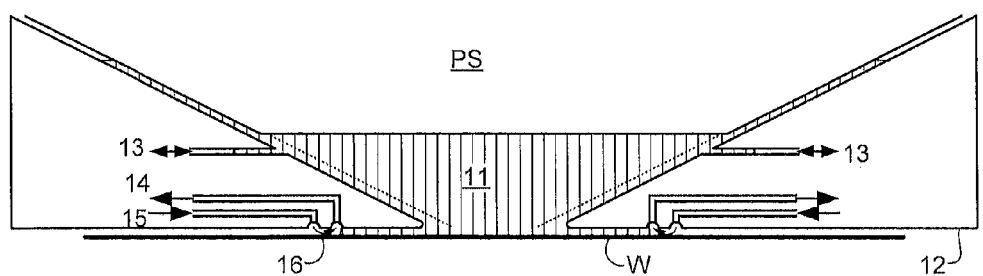
FIG. 5 depicts a further liquid supply system for use in a lithographic projection apparatus.

Another arrangement which has been proposed is to provide the liquid supply system with liquid confinement structure which extends along at least a part of a boundary of the space between the final element of the projection system and the substrate table. Such an arrangement is illustrated in FIG. 5. Arrows indicate the direction of flow.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition, or in the alternative, to a surface of the substrate table WT, unless expressly stated otherwise. Reference to movement of the substrate relative to another object, for example a projection system, includes reference to movement of the substrate table relative to the same object, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W. The seal may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round or any other suitable shape. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

In an immersion lithographic apparatus, immersion liquid may be left on the substrate tables after completion of exposures of a substrate. This will almost always occur in unconfined or all wet immersion apparatus but may also occur in localized apparatus if droplets escape from the liquid containment structure. Such a droplet left behind on the substrate table may be undesirable. In particular, a substrate table, as well as supporting a substrate, often has sensor devices or targets in its surface. For example, in a dual-stage lithographic apparatus, the substrate table may be provided with one or more fiducials. A fiducial is used during the pre-measurement phase prior to exposure of the substrate. In particular, the fiducials may be used as a reference point to establish the positions of markers on the substrate. A fiducial may include a marker detectable by an adjustment sensor and corresponding to an alignment marker on a substrate permanently formed in a fixed plate. An image sensor, such as a Transmission Image Sensor (TIS), may be located underneath or in fixed relationship to the marker. A fiducial may also include a flat area acting as a reference plane for a level or height sensor. Other sensors or sensor targets that may be included in the substrate table include grid plates for position encoding systems, energy sensors and interferometric aberration sensors.

The presence of residual immersion liquid, such as water, on such a sensor or sensor target may cause problems through two causes. The presence of a residual immersion liquid as a droplet when a measurement is being taken can cause erroneous readings if the measurement system and procedure is designed to make a measurement in the dry state. Evaporation of a residual immersion liquid droplet may leave behind a drying stain. A drying stain may affect a measurement or may cause localized cooling. Localized cooling may cause deformation of the sensor, e.g. a reference sensor. In this way an erroneous sensor measurement may be made. A sensor or sensor target may have a liquidphilic surface, i.e. a surface that attracts liquid, or a surface that becomes liquidphilic during use of the apparatus, e.g. through exposure to radiation of the projection beam. The liquidphilic surface may be hydrophilic with respect to water. Thus liquid may often be present on the sensor or sensor target. As the surface becomes liquidphilic, liquid is more likely to remain on the surface than the surrounding surfaces. Such remaining liquid may be a source of contamination, may cause a heat load or both.

In a so-called dual-stage lithographic apparatus, a substrate is first loaded onto a substrate table. Various measurements are then made at a measurement station. The table and substrate are then transferred to exposure station, subsequently, the substrate is exposed. After all exposures on the substrate are complete, the exposed substrate is unloaded and a new substrate loaded onto the table. A liquid droplet left on the substrate table after exposure of the preceding substrate may therefore adversely effect measurements made on the succeeding substrate, either by its presence or by the effects of its evaporation.

An embodiment of the invention addresses one or more of these undesirable outcomes by providing a liquid displacement device. The liquid displacement device is arranged to displace liquid from the sensor or target and off the substrate table by use of a localized gas flow directed towards the sensor or target. In an embodiment, the gas may be: air; a clean, dry gas, such as air; a gas which is an artificial air; $N_2$ or another inert gas, such as a noble gas.

In addition, an embodiment of the invention provides a cover that extends from an edge of the table. The liquid displacement device is arranged to direct the localized gas flow such that liquid displaced from the sensor or target passes over the cover and off the table. The cover may be arranged such that it prevents the displaced liquid from interfering with another component that may be affected by the liquid. In other words, the cover may prevent the problem of residual liquid on the sensor or target being replaced with a new problem.

Figure 6:
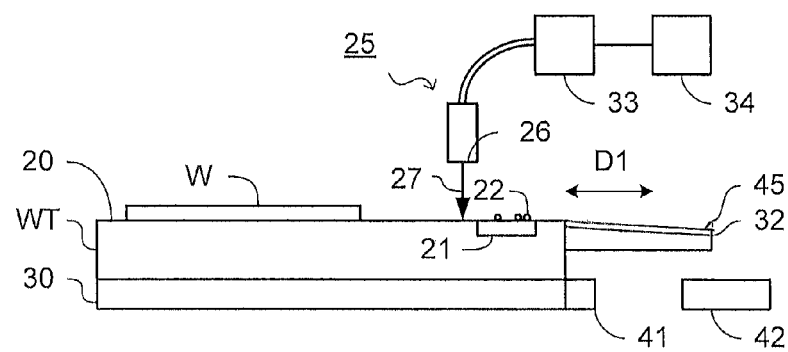
FIGS. 6, 7 and 8 depict a liquid displacement device according to an embodiment of the invention during operation.
Figure 7:
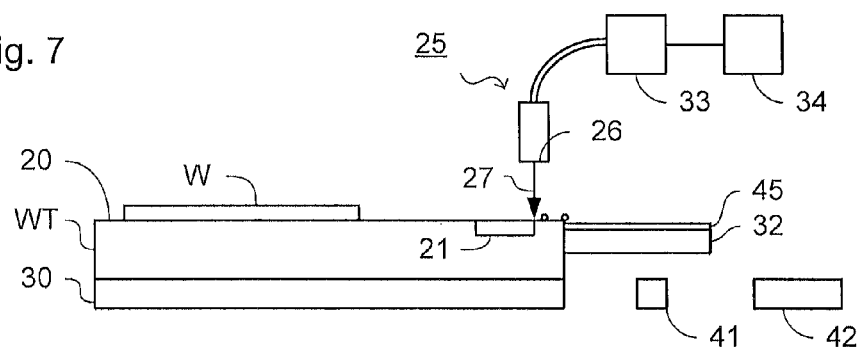
Figure 8:
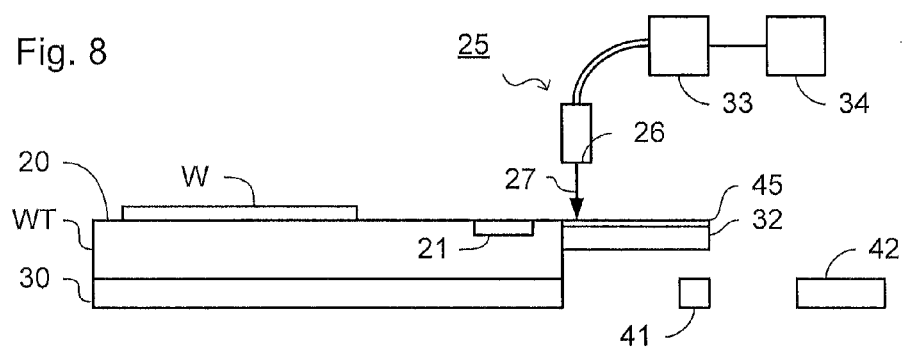

FIGS. 6, 7 and 8 depict an embodiment of the invention in a cross-section through the substrate table. For convenience, the Figures depict a substrate W supported on the substrate table WT. However, it should be appreciated in the subsequent description that the substrate W need not be present for the performance of the invention.

As shown, the upper surface 20 of the substrate table WT may include one or more sensors or sensor targets 21. One or more liquid droplets or a liquid film 22 may initially be present on the sensor or target 21.

In an embodiment of the invention, the apparatus includes a liquid displacement device 25 including a gas outlet 26 providing a localized gas flow 27 towards the upper surface 20 of the substrate table WT and/or the sensor or target 21. In particular, the localized gas flow may form a gas knife.

The localized gas flow 27 may be configured such that it is sufficient to displace liquid on the upper surface 20 of the substrate table WT and/or the sensor or target 21. In particular, it will be appreciated that the width of the gas outlet 26, the gas flow rate and the separation of the gas outlet 26 from the upper surface 20 of substrate table WT may be appropriately selected in order to provide the required effect of displacing liquid.

In addition, the length of the gas outlet 26 may be selected such that the localized gas flow 27 has a sufficient length to extend across the width of the sensor or target 21, for example, if it is desired to displace substantially all of the liquid 22 on the sensor or target 21. Alternatively, length of the gas outlet 26 may be selected such that the localized gas flow 27 is slightly longer than the width of the sensor or target 21. Alternatively, the gas outlet 26 may be shorter than this if it is sufficient to remove liquid 22 from only a portion of the sensor or target 21.

It will be appreciated that the gas flow rate required to provide the localized gas flow 27 may depend on the length of the opening, the separation of the opening from the surface on which the localized gas flow 27 is to be provided and the nature of the surface from which liquid is to be cleared. For example, a sensor may have a hydrophobic surface and a width of 65 mm. In this case, a gas outlet 26 having a length of 67 mm may be used, separated from the surface of the sensor by 60 μm, together with a gas flow rate of 70 liters per minute. In another example, a sensor with a hydrophilic surface and a width of 8 mm may be provided. In this case, a gas outlet 26 having a length of 10 mm may be used, separated from the surface of the sensor by 2100 μm, together with a gas flow rate of 34 liters per minute. In general the gas outlet 26 may be provided up to approximately 3 mm from the surface from which liquid is to be removed.

The apparatus may further include an actuator system (broadly termed an "actuator") 30 configured to move and position the substrate table WT. Accordingly, as depicted successively in FIGS. 6, 7 and 8, the actuator 30 may move the substrate table WT relative to the gas outlet 26. In turn, the localized gas flow 27 may advance across the sensor or target 21, displacing the liquid 22.

As shown, in an embodiment of the invention, the apparatus includes a cover 32 extending from the edge of the substrate table WT. As the substrate table WT moves relative to the gas outlet 26, the liquid may be displaced from the sensor or target 21 across the cover 32. Subsequently, the liquid 22 may be displaced completely from the substrate table WT. As shown, in an embodiment, the localized gas flow 27 may advance across the sensor or target 21 towards the cover 32 and subsequently at least partly across the cover 32.

Figure 9:
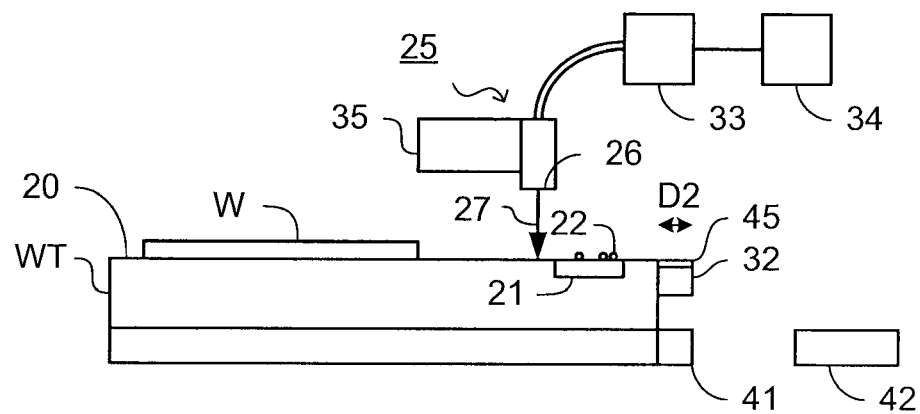
FIG. 9 depicts a liquid displacement device according to an embodiment of the present invention.

As explained above, an actuator 30 may be provided to move and position the substrate table WT. This actuator may be used to provide movement of the substrate table WT relative to the gas outlet 26 and the localized gas flow 27. Alternatively or additionally, as depicted in FIG. 9, an actuator 35 may be provided that is configured to move the gas outlet 26. Accordingly, the movement of the gas outlet 26 and the localized gas flow 27 relative to the substrate table WT may alternatively or additionally be provided by the use of the actuator system 35 for moving the gas outlet 26.

The gas outlet 26 may be connected to a gas supply 33 that provides the gas for the localized gas flow 27. A controller 34 may be provided that controls the gas supply 33. For example, the controller 34 may control at least one of the pressure of the gas supplied to the gas outlet 26, the gas flow rate of the localized gas flow 27, the composition of the gas and the temperature of the gas.

In an embodiment, the gas supplied by the gas supply 33 may be an extremely clean and dry gas, such as air. In particular, the content or partial pressure of water within the gas may be below a predetermined threshold. For example, the gas may have less than about 100 ppbv of water. The use of extremely dry gas, such as air, for the localized gas flow 27 may beneficially improve the performance of the removal of the liquid 22 from the sensor or target 21. In particular, small droplets that may otherwise remain on the sensor or target 21 may evaporate more easily than would be the case using gas with a greater moisture content.

It should be appreciated that gases with higher water contents may also be used. For embodiments in which the separation between the gas outlet 26 and the surface from which liquid is to be removed is above about 1 mm, the humidity of the gas provided may be up to about 40%. If the separation is less than about 1 mm, the humidity may be up to about 60%.

The arrangement of the liquid displacement device 25 and the cover 32 may be specifically configured such that liquid displaced from the substrate table WT is not displaced to one or more components 41 that may be affected by liquid droplets. Such liquid droplet sensitive components may be components that are damaged by droplets or may function in a different manner as a result of interaction with the droplets. In either case, this may result in undesired variation in the operation of the lithographic apparatus. Droplet sensitive components 41 may include electronics, for example associated with an actuator system such as the actuator system 30 for moving and positioning the substrate table WT. The droplet sensitive components 41 may include encoders or interferometers, for example which may be used to monitor the position or displacement of the substrate table WT. In addition, droplets sensitive components 41 may include a crash rim, or bumper, provided to prevent damage that may be caused by an accidental collision with the substrate table WT. Such components may include, for example, a glue that may be damaged by contact with the liquid.

As depicted in FIGS. 7 through 9, the cover 32 may be configured such that during the operation of the process to displace liquid from the sensor or target 21, the cover 32 extends over the droplet sensitive components 41. In this case, the liquid droplets 22 displaced from the sensor or target 21 across the cover 32 may not fall on the droplet sensitive components 41.

The droplet sensitive components 41 may be associated with the substrate table WT, namely move with the substrate table WT. In that case, the cover may simply be configured to extend beyond the furthest edge of the droplet sensitive component 41 from the edge of the substrate table WT.

In an embodiment of the invention, the droplet sensitive component 41 may be a fixed component within the lithographic apparatus such that the substrate table WT moves relative to the droplet sensitive component 41. In this case, the cover 32 may be configured to ensure that it extends over the droplet sensitive component 41 during the liquid displacement process for the position of the substrate table WT during that process.

In an arrangement in which the movement of the localized gas flow 27 relative to the sensor or target 21 is provided by movement of the gas outlet 26, the width D2 of the cover 32, in a direction substantially parallel to the movement of the gas outlet 26 relative to the sensor or target 21 (namely substantially parallel to the upper surface 20 of the substrate table WT) by at least the width in that direction of the droplet sensitive components 41.

In an arrangement in which the movement of the localized gas flow 27 relative to the sensor or target 21 is provided by movement of the substrate table WT, the width D1 of the cover may need to be greater. For example, the width of the cover 32 may be greater to ensure that, when the liquid displacement process is completed, the edge of the cover 32 furthest from the substrate table WT is at least as far from the edge of the substrate table WT as the furthest edge of the droplet sensitive component 41.

In order to ensure that liquid displaced from the sensor or target 21 does not fall on droplet sensitive components 41, the liquid displacement device 25 and the cover 32 may be specifically configured such that displaced liquid instead falls on components 42 of the lithographic apparatus that are not sensitive to droplets of liquid. For example, such components 42 may function within required specifications if the droplets of liquid are directed onto these components. Such components 42 may, for example, function adequately with the application of a small heat load and/or a relatively small amount of contamination. Such components 42 may include, for example, a magnetic plate that is used in conjunction with the actuator system 30 used to move and position the substrate table WT.

In order to control the location on which displaced liquid lands, the angle of an upper surface of the cover 32 relative to the upper surface 20 of the substrate table WT may be selected. Accordingly, droplets of liquid may pass across the cover 32 at a particular angle (see, e.g., FIG. 6) such that the subsequent trajectory of the droplets 22 results in the droplets landing in a desired region, for example on non-sensitive components 42. For example, the upper surface of the cover 32 may be provided at a selected angle in the range of about 10° above the plane of the upper surface of the substrate table WT to about 60° below the plane of the upper surface of the substrate table WT. In an embodiment, the upper surface of the cover 32 may be provided at an angle approximately 30° below the plane of the upper surface of the substrate table WT.

In an embodiment of the invention, the cover 32 may be provided with a superhydrophobic coating 45. For example, a superhydrophobic coating may be a repeated series of very small bumps, for example of the order of about 10 μm across which prevent the liquid from wetting the surface. The liquid droplets 22 may roll across such a coating 45 with a minimum of interaction with the surface.

Figure 10:
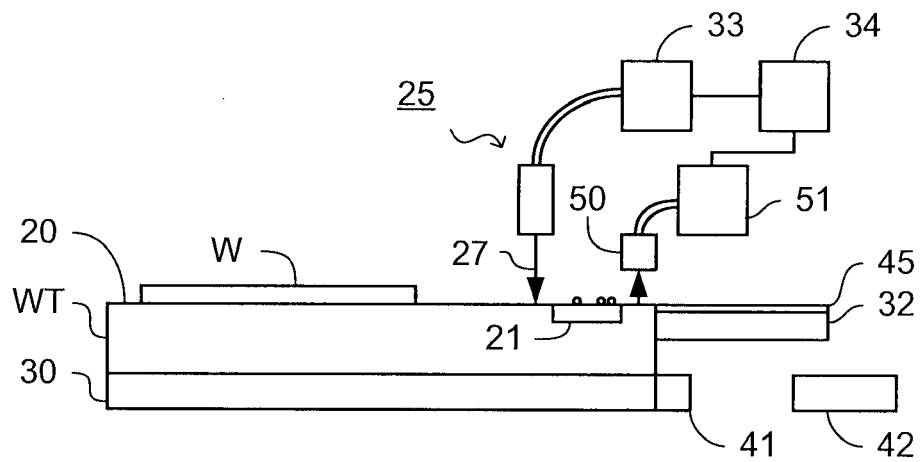
FIG. 10 depicts a liquid displacement device according to an embodiment of the present invention.

As depicted in FIG. 10, in an embodiment of the invention, an aperture 50 may be provided to extract some of the liquid displaced from the sensor or target 21. In such an arrangement, not all of the displaced liquid is ejected across the cover 32. In such an arrangement, a greater number of components may not be sensitive to the amount of liquid that is displaced from the substrate table WT. The aperture 50 may be connected to an underpressure source 51. As shown, the underpressure source 51 may be controlled by the same controller 34 that is used to control the gas supply 33. Alternatively, a separate controller may be provided.

FIGS. 11 to 17 depict, in plan view, embodiments of a lithographic apparatus of the invention having an exposure station 61 and a measurement station 62 as discussed above. As is explained below, the embodiment depicts optional locations in which the liquid displacement device 25 may be provided. It should be appreciated that embodiments of the present invention may combine two or more such arrangements, for example may include two or more liquid displacement devices in different locations.

Figure 11:
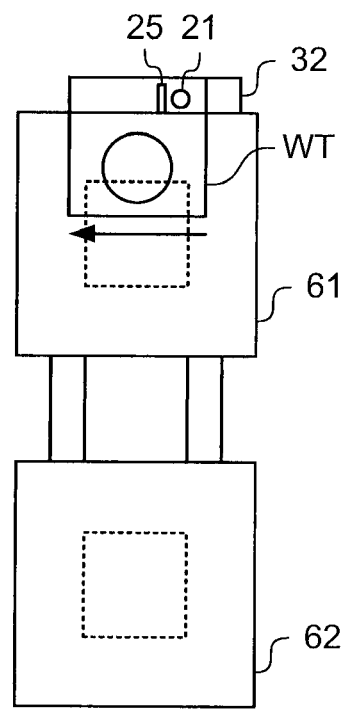
FIGS. 11 to 17 depict arrangements of a lithographic apparatus including a liquid displacement device according to an embodiment of the present invention.

In the arrangement depicted in FIG. 11, the liquid displacement device 25 is provided in the exposure station 61. The movement of the liquid displacement device relative to the substrate table WT in this arrangement is provided by the movement of the substrate table WT. Accordingly, as the substrate table WT moves in the direction shown in the Figure, the liquid displacement device moves relative to the sensor or target 21 and towards the cover 32.

In an embodiment, the lithographic apparatus may include two substrate tables WT. In such an apparatus, a sequence of movements may be provided in order to swap from exposure of one substrate table WT to another substrate table WT at the exposure station 61. The liquid displacement device may be positioned such that the localized gas flow advances across the sensor or target 21 during such a swap process. This may prevent additional time being required to displace liquid from the sensor or target 21.

Figure 12:
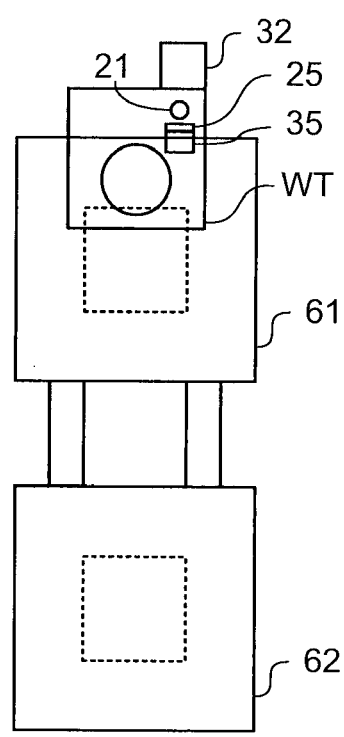

FIG. 12 depicts an embodiment of the invention in which the liquid displacement device is provided in the exposure station 61. In this arrangement, the movement of the liquid displacement device 25 relative to the substrate table WT is provided by an actuator 35 that moves the liquid displacement device such that the localized gas flow advances across the sensor or target 21 towards the cover 32. The substrate table WT may be stationary during the liquid displacement process. Alternatively, the actuator 35 for moving the liquid displacement device 25 may be configured such that the liquid displacement process can occur while the substrate table WT is moving, for example during a substrate table swap process as discussed above.

Figure 13:
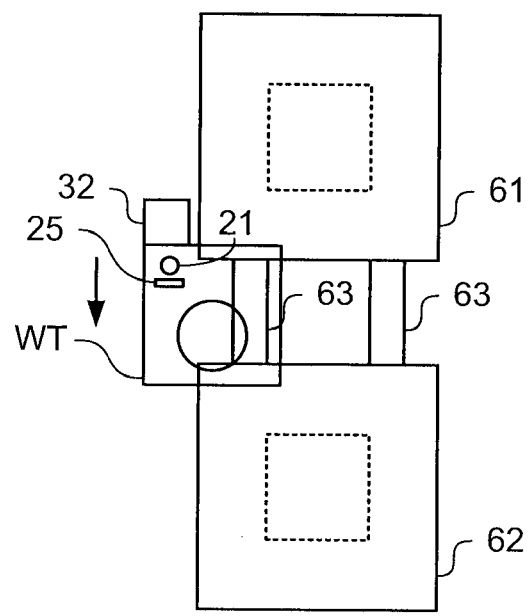

The lithographic apparatus may be configured such that the substrate table WT can be transferred between the exposure station 61 and the measurement station 62 along one or more transfer paths 63. As depicted in FIG. 13, in an embodiment the liquid displacement device 25 may be positioned adjacent such a transfer path 63 such that the localized gas flow advances across the sensor or target 21 towards the cover 32 as the substrate table WT passes along the transfer path 63. Such an arrangement may permit the performance of the liquid displacement process shortly after the completion of the exposure process without the requirement for additional components in the exposure station 61. Such an arrangement may also avoid increasing the processing time for each substrate W.

Figure 14:
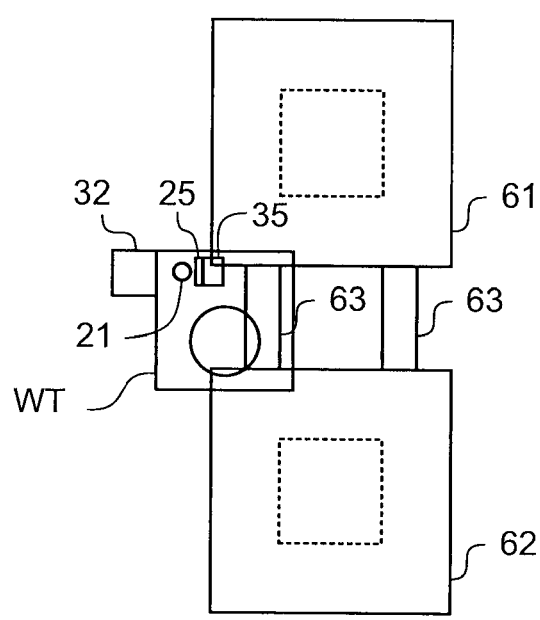

As depicted in FIG. 14, in an embodiment a liquid displacement device 25 that is moved by an actuator 35 to provide the relative movement of the localized gas flow and the substrate table WT may also be provided adjacent to the transfer path 63 between the exposure station 61 and the measurement station 62. In such an arrangement, the substrate table WT may pause on the transfer path for the performance of the liquid displacement process. Alternatively, the actuator 35 for moving the liquid displacement device may be configured such that the localized gas flow may advance across the sensor or target 21 towards the cover 32 while the substrate table WT is passing along the transfer path 63.

Figure 15:
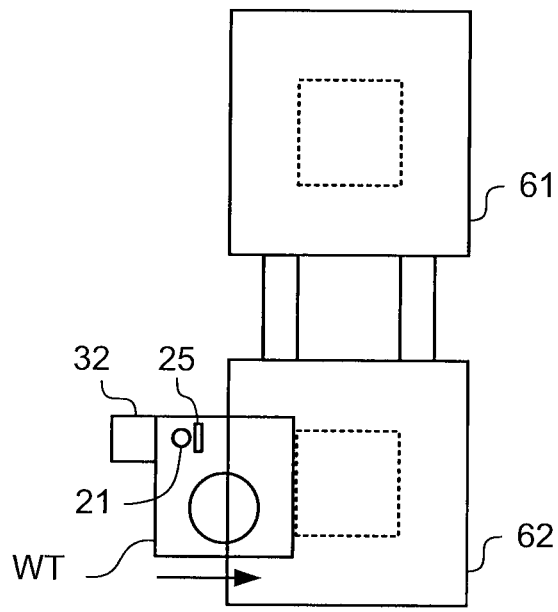
Figure 16:
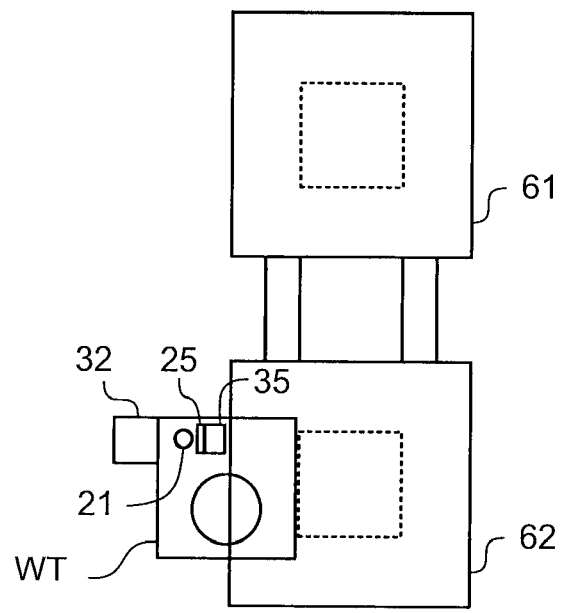

As depicted in FIGS. 15 and 16, the liquid displacement device may be provided in the measurement station 62. As shown in FIG. 15, in an embodiment the liquid displacement device 25 is positioned such that, as the substrate table WT moves within the measurement station 62, the localized gas flow advances across the sensor or target 21 towards the cover 22. For example, the liquid displacement device 25 may be positioned such that this process occurs during a movement of the substrate table WT that is required in order to initiate or perform the measurement process to be performed by the measurement station 62.

In an embodiment as depicted in FIG. 16, the liquid displacement device 25 is provided with an actuator 35 that advances the localized gas flow across the sensor or target 21 towards the cover 32. In a similar manner to that discussed above, in such an embodiment, the substrate table WT may be stationary within the measurement station 62 during the liquid displacement process. Alternatively, the actuator 35 may be configured such that it can move the liquid displacement device to advance the localized gas flow across the sensor or target 21 towards the cover 32 while the substrate table WT is moving.

Figure 17:
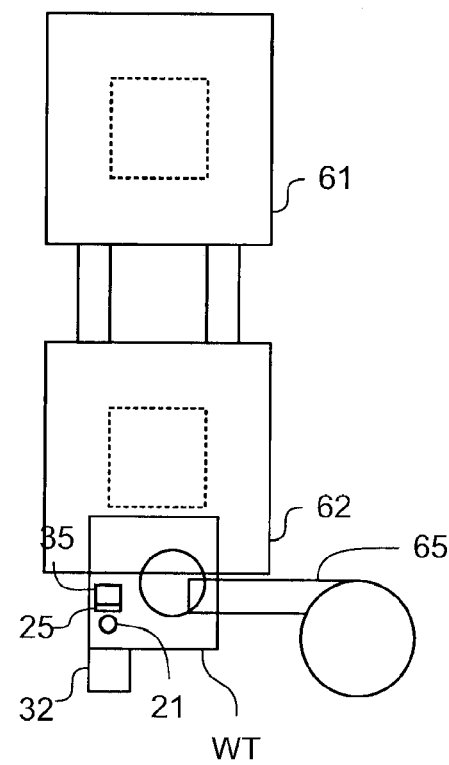

As depicted in FIG. 17, in an embodiment a loading station 65 may be provided for loading substrates W to a substrate table WT and unloading substrates W from a substrate table WT. For example, as depicted in FIG. 17, this may occur in, or adjacent to, the measurement unit 62. The liquid displacement device 25 may be provided adjacent to the loading station 65 such that the liquid displacement process may occur immediately before, during, or immediately after a loading and/or unloading process. Accordingly, for example, an actuator 35 may be provided to move the liquid displacement device such that the localized gas flow advances across the sensor or target 21 towards the cover 32 while the substrate table WT is stationary in the location required for the loading/unloading process.

It will be appreciated that a substrate table WT may include two or more sensors and/or targets. In such an arrangement, a cover may be provided that is associated with each sensor or target. In addition, the liquid displacement device may include a respective gas outlet for each sensor or target, each arranged to provide a localized gas flow that advances towards the respective sensor or target to displace liquid from the sensor or target over the associated cover and off the table.

It will be appreciated that although the arrangement discussed above refers to each sensor or target 21 having a respective cover, in practice it may be convenient to provide a single structure. In that case each cover associated with the respective sensor or target corresponds to a portion of that structure.

Figure 18:
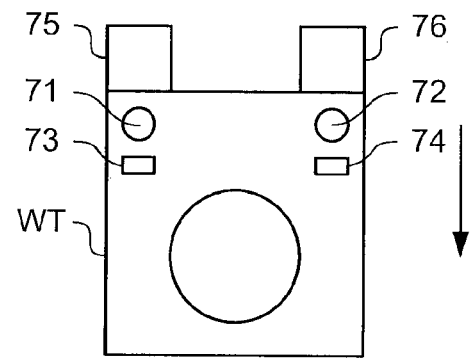
FIG. 18 depicts a liquid displacement device according to an embodiment of the present invention.

FIG. 18 depicts in plan view an embodiment of the invention in which a substrate table WT includes two sensors 71,72. In this case, as depicted, the liquid displacement device may include a gas outlet 73,74 associated with each sensor and/or target 71,72. Each gas outlet 73,74 provides a respective localized gas flow. The substrate table WT may then be moved in a single direction such that the localized gas flows provided by the gas outlets 73,74 advance towards the respective sensors and/or targets 71,72 to displace liquid from the sensors and/or targets, over respective covers 75,76 and off the substrate table WT.

Figure 19:
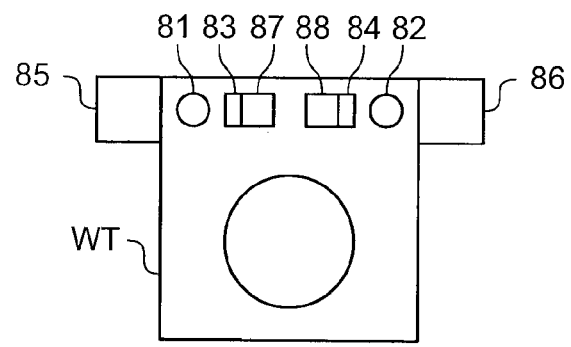
FIG. 19 depicts a liquid displacement device according to an embodiment of the present invention.

FIG. 19 depicts a further embodiment of the invention having two sensors and/or targets 81,82 on a substrate table WT. A gas outlet 83,84 is provided for each sensor and/or target 81,82 and configured to provide a respective localized gas flow towards the respective sensor and/or target 81,82. In this embodiment, a respective actuator system 87,88 may be provided to move the respective gas outlets 83,84 such that the localized gas flow from each advances towards the respective sensor and/or target 81,82 to displace liquid from the sensors and/or targets over the respective covers 85,86 and off the substrate table WT. It will be appreciated that the separate actuator systems 87,88 may be replaced by a combined actuator system that provides the same movement of the gas outlets 83,84 as discussed above.

Figure 20:
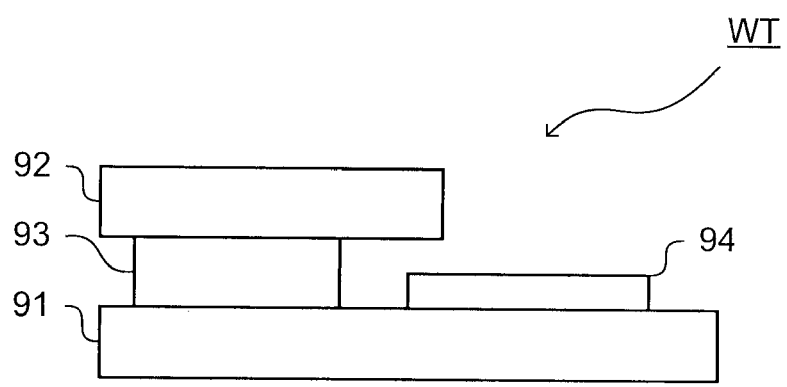
FIG. 20 depicts a substrate table according to an embodiment of the present invention.

In an embodiment, the actuator configured to move and/or position the substrate table WT may include a long-stroke module 91 and a short-stroke module 92 as depicted in FIG. 20. The short-stroke module 92 may be moved relative to the long-stroke module 91 using an actuator 93. In this embodiment a cover 94 may be connected to the long-stroke module. This may provide the benefit that no extra mass is added to the short-stroke module. This in turn prevents deterioration of the dynamics of the short-stroke module that is used for fine positioning. As the long-stroke module is used for coarse positioning, the added mass of the cover does not negatively influence the performance of the lithographic apparatus. As with previous embodiments, the cover 94 may prevent liquid from reaching one or more components of the lithographic apparatus, such as the actuator, that may be sensitive to contamination by the liquid.

As will be appreciated, any of the above described features can be used with any other feature and it is not only those combinations explicitly described which are covered in this application.

In an embodiment, there is provided a lithographic apparatus comprising a table, a liquid handling structure and a liquid displacement device. The table is configured to support a substrate. The table has a surface on which is provided a sensor, a target for a sensor, or both. The liquid handling structure is configured to provide liquid to a space adjacent the substrate and/or table. The liquid displacement device comprises a gas outlet configured to direct a localized gas flow towards the sensor or target, or both, so as to displace liquid from the sensor and/or target and off the table.

The lithographic apparatus may comprise a cover extending from an edge of the table. The liquid displacement device may be configured such that liquid is displaced from the sensor or target over the cover and off the table.

The lithographic apparatus may comprise an actuator configured to move the table such that the localized gas flow advances across the sensor or target towards the cover.

The cover may be configured so as to cover components of the actuator. The actuator may comprise a short-stroke module. The actuator may comprise a long-stroke module.

The cover may be attached to the short-stroke module, long-stroke module, or both, to cover components of the long-stroke module.

The liquid displacement device may comprise an actuator configured to move the gas outlet such that the localized gas flow advances across the sensor or target towards the cover.

The actuator may be configured such that the localized gas flow advances across at least a part of the cover after advancing across the sensor or target.

The cover and the liquid displacement device may be configured such that liquid displaced from the table is directed onto one or more components of the lithographic apparatus that may function within required specifications if droplets of liquid are directed onto the one or more components.

A superhydrophobic coating may be formed on the cover.

The cover may comprise a surface which is provided at an angle relative to the surface of the table. The angle may be selected such that the droplets displaced by the localized gas flow over the surface. Then the droplets may have a trajectory after leaving the cover that results in the droplets landing in a desired region of the lithographic apparatus.

The upper surface of the cover may be provided at a selected angle relative to the plane of the upper surface of the table in the range of from about 10° above the plane to about 60° below the plane of the upper surface of the substrate table. The angle may desirably be at approximately about 30° below the plane of the upper surface of the substrate table.

The cover may extend from the table in a first direction, substantially parallel with the surface of the table. The extension may be at least the width in the first direction of at least one component of the lithographic apparatus that is adjacent the table when the table is arranged for the operation of the liquid displacement device.

The gas outlet may be connected to a source of gas having a content of water of less than about 100 ppbv. The localized gas flow may form a gas knife.

The liquid displacement device may comprise an aperture configured to remove at least a part of the liquid displaced from the sensor or target. The aperture may be connected to an underpressure source.

A second sensor or target may be provided on the surface of the table. The lithographic apparatus may comprise a second cover extending from an edge of the table. The liquid displacement device may comprise a second gas outlet configured to direct a second localized gas flow towards the second sensor or target so as to displace liquid from the second sensor or target over the second cover and off the table.

The lithographic apparatus may further comprise a measurement station having a sensor configured to measure a property of the substrate and/or table. An exposure station having a projection system configured to project an image onto a substrate may be supported by the table. The liquid displacement device may be positioned in one of the measurement station and the exposure station.

The lithographic apparatus may further comprise a second liquid displacement device positioned in the other of the measurement station and exposure station. The liquid displacement device may be configured to direct a localized gas flow towards the sensor or target so as to displace liquid from the sensor or target over the cover and off the table.

The lithographic apparatus may further comprise a measurement station having a sensor configured to measure a property of the substrate and/or table. An exposure station having a projection system configured to project an image onto a substrate may be supported by the table. A table transfer device may be configured to transfer the table between the measurement and exposure stations along a transfer path. The liquid displacement device may be positioned adjacent the transfer path.

The lithographic apparatus may further comprise a loading device configured to load a substrate onto and/or unload the substrate from the table. The liquid displacement device may be positioned adjacent the loading device.

In an embodiment there is provided a device manufacturing method comprising projecting an image of a pattern through an immersion liquid onto a substrate held by a table. The table has a cover extending from an edge of the table. The table further has a surface on which is provided a sensor, a target for a sensor, or both. The method further comprises displacing liquid from the sensor and/or target using a localized gas flow such that the liquid is displaced off the table, or onto the cover at the edge of the table, or both.

The method may further comprise moving the table such that the localized gas flow advances across the sensor or target towards the cover.

The method may further comprise moving the gas outlet such that the localized gas flow advances across the sensor or target towards the cover.

The table may be moved relative to the gas outlet such that the localized gas flow advances across at least a part of the cover after advancing across the sensor or target.

The liquid displaced from the table may be directed onto one or more components of the apparatus performing the method that may function within required specifications if droplets of liquid are directed onto the one or more components.

A surface of the cover may be provided at an angle relative to the surface of the table. The angle may be such that the droplets displaced by the localized gas flow over the surface. Then the droplets may have a trajectory after leaving the cover that results in the droplets landing in a desired region of an apparatus performing the method.

The method may further comprise providing a flow of gas to the gas outlet that has a content of water of less than about 100 ppbv.

The method may further comprise connecting an underpressure source to an aperture in order to remove at least part of the liquid displaced from the sensor or targets.

A second sensor or target may be provided on the surface of the table. A second cover may extend from the edge of the table. The method may further comprise displacing liquid from the second sensor or target using a second localized gas flow such that liquid is displaced over the second cover and off the table.

The image of the pattern may be projected onto the substrate at an exposure station. The method may further comprise measuring a property of the substrate and/or table at a measurement station. The liquid may be displaced from the target or sensor or both by a localized gas flow provided in one or both of the measurement station and the exposure station.

The method may further comprise transferring the table between the measurement and exposure stations along a transfer path. Liquid may be displaced from the target, the sensor, or both using the localized gas flow during the transfer along the transfer path.

The method may further comprise loading a substrate onto the table and/or unloading the substrate from the table using a loading device. Liquid may be displaced from the target or sensor or both using the localized gas flow during the loading and/or unloading operation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may include a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. In an embodiment, the immersion liquid may be water.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a table configured to support a substrate, the table having an upper surface, said upper surface to receive said substrate and a sensor, a target for a sensor, or both;
   a liquid handling structure configured to provide liquid to a space adjacent the substrate and/or table;
   a liquid displacement device comprising a gas outlet configured to direct a localized gas flow towards the sensor or target, or both on said upper surface; and
   a cover attached to an outer edge of the table and extending from the outer edge of the table and away from the upper surface of the table, wherein the liquid displacement device is configured such that liquid is displaced from the sensor or target off the outer edge of the table, and wherein the cover comprises a surface which is contiguous with the upper surface of the table so that, in use, droplets of liquid present on the sensor or target or both are displaced by the localized gas flow from the upper surface to the surface of the cover.

2. A lithographic apparatus according to claim 1, comprising an actuator configured to move the table such that the localized gas flow advances across the sensor or target towards the cover.

3. A lithographic apparatus according to claim 1, wherein the liquid displacement device comprises an actuator configured to move the gas outlet such that the localized gas flow advances across the sensor or target towards the cover.

4. A lithographic apparatus according to claim 3, wherein the actuator is configured such that the localized gas flow advances across at least a part of the cover after advancing across the sensor or target.

5. A lithographic apparatus according to claim 1, wherein the cover and the liquid displacement device are configured such that liquid displaced from the table is directed onto one or more components of the lithographic apparatus that may function within required specifications if droplets of liquid are directed onto the one or more components.

6. A lithographic apparatus according to claim 1, wherein a superhydrophobic coating is formed on the cover.

7. A lithographic apparatus according to claim 1, wherein the cover extends from the table in a first direction, substantially parallel with the surface of the table, by at least the width in the first direction of one or more components of the lithographic apparatus that are adjacent the table when the table is arranged for the operation of the liquid displacement device.

8. A lithographic apparatus according to claim 1, wherein the gas outlet is connected to a source of gas having a content of water of less than about 100 ppbv.

9. A lithographic apparatus according to claim 1, wherein the localized gas flow forms a gas knife.

10. A lithographic apparatus according to claim 1, wherein the liquid displacement device comprises an aperture configured to remove at least a part of the liquid displaced from the sensor or target.

11. A lithographic apparatus according to claim 10, wherein the aperture is connected to an underpressure source.

12. A lithographic apparatus according to claim 1, wherein a second sensor or target is provided on the surface of the table;

the lithographic apparatus comprises a second cover extending from an edge of the table; and the liquid displacement device comprises a second gas outlet configured to direct a second localized gas flow towards the second sensor or target so as to displace liquid from the second sensor or target over the second cover and off the table.

13. A lithographic apparatus according to claim 1, further comprising a measurement station having a sensor configured to measure a property of the substrate and/or table; and an exposure station having a projection system configured to project an image onto a substrate supported by the table;

wherein the liquid displacement device is positioned in one of the measurement station and the exposure station.

14. A lithographic apparatus according to claim 13, further comprising a second liquid displacement device positioned in the other of the measurement station and exposure station, configured to direct a localized gas flow towards the sensor or target so as to displace liquid from the sensor or target over the cover and off the table.

15. A lithographic apparatus comprising:
a table configured to support a substrate, the table having a surface on which is provided a sensor, a target for a sensor, or both;
a liquid handling structure configured to provide liquid to a space adjacent the substrate and/or table;
a liquid displacement device comprising a gas outlet configured to direct a localized gas flow towards the sensor or target, or both; and
a cover extending from an edge of the table,
wherein the liquid displacement device is configured such that liquid is displaced from the sensor or target off the table, and
wherein the cover comprises a surface which is provided at an angle relative to the surface of the table which is selected such that droplets of liquid displaced by the localized gas flow over the surface have a trajectory after leaving the cover that results in the droplets landing in a desired region of the lithographic apparatus.

16. A lithographic apparatus according to claim 15, wherein the upper surface of the cover is provided at a selected angle relative to the plane of the upper surface of the table in the range of from about 10° above the plane to about 60° below the plane of the upper surface of the substrate table.

17. A device manufacturing method comprising:
projecting an image of a pattern through an immersion liquid onto a substrate held by a table, the table having an upper surface, said upper surface to receive said substrate and a sensor, a target for a sensor, or both, wherein a cover is attached to an outer edge of the table and extends from the outer edge of the table and away from the upper surface of the table, the cover comprising a surface which is contiguous with the upper surface of the table; and
displacing liquid from the sensor and/or target using a localized gas flow such that the liquid is displaced off the outer edge of the table onto the surface of the cover at the edge of the table or both.

18. The method of claim 17, further comprising moving the table such that the localized gas flow advances across the sensor or target towards the cover.

19. The method of claim 17, further comprising moving the gas outlet such that the localized gas flow advances across the sensor or target towards the cover.

20. A lithographic apparatus comprising:
a table configured to support a substrate, the table having an upper surface, said upper surface to receive said substrate and a sensor, a target for a sensor, or both;
a liquid handling structure configured to provide liquid to a space adjacent the substrate and/or table;
a liquid displacement device comprising a gas outlet configured to direct a localized gas flow towards the sensor or target, or both on said upper surface; and
a cover comprising an upper surface provided adjacent the upper surface of the table so that said upper surface of the cover and said upper surface of the table are contiguous, said cover extending from an outer edge of the table and away from the upper surface of the table,
wherein the liquid displacement device is configured such that liquid is displaced from the sensor or target off the outer edge of the table, and
wherein the cover comprises the upper surface which is contiguous with the upper surface of the table so that, in use, droplets of liquid present on the sensor or target or both are displaced by the localized gas flow from the upper surface of the table to the upper surface of the cover.

21. A lithographic apparatus according to claim 20, comprising an actuator configured to move the table such that the localized gas flow advances across the sensor or target towards the cover.

22. A lithographic apparatus comprising:
- a table configured to support a substrate, the table having an upper surface, said upper surface to receive said substrate and a sensor, a target for a sensor, or both;
- a liquid handling structure configured to provide liquid to a space adjacent the substrate and/or table;
- a liquid displacement device comprising a gas outlet configured to direct a localized gas flow towards the sensor or target, or both on said upper surface; and
- a cover in contact with an outer edge of the table and extending from the outer edge of the table and away from the surface of the table,
- wherein the liquid displacement device is configured such that liquid is displaced from the sensor or target off the outer edge of the table, and
- wherein the cover comprises a surface which is contiguous with the upper surface of the table so that, in use, droplets of liquid present on the sensor or target or both are displaced by the localized gas flow from the upper surface to the surface of the cover.

23. A lithographic apparatus according to claim 22, comprising an actuator configured to move the table such that the localized gas flow advances across the sensor or target towards the cover.

* * * * *